(12) United States Patent
Israelowitz et al.

(10) Patent No.: US 10,217,891 B2
(45) Date of Patent: Feb. 26, 2019

(54) METHOD FOR PRODUCING BIOMIMETIC-INSPIRED INFRARED SENSORS FROM ZINC PHOSPHIDE MICROWIRES

(71) Applicants: Medizinische Hochschule Hannover, Hannover (DE); BIOMIMETICS TECHNOLOGIES INC., Toronto (CA); Universitat de Valáncia, Valéncia (ES)

(72) Inventors: Meir Israelowitz, Hannover (DE); Herbert Peter von Schroeder, Toronto (CA); Syed Rizvi, Lake Mary, FL (US); Chris Holm, Wuppertal (DE); Christoph Gille, Berlin (DE); Birgit Weyand, Hannover (DE); Kerstin Reimers-Fadhlaoui, Hannover (DE); Peter Vogt, Hannover (DE); Vicente Muñoz-SanJosé, Valéncia (ES)

(73) Assignees: UNIVERSITAT DE VALENCIA, Valencia (ES); BIOMIMETICS TECHNOLOGIES INC., Toronto (CA); MEDIZINISCHE HOCHSCHULE HANNOVER, Hannover (DE)

(*) Notice: Subject to any disclaimer, the term of this patent is extended or adjusted under 35 U.S.C. 154(b) by 0 days.

(21) Appl. No.: 14/272,801

(22) Filed: May 8, 2014

(65) Prior Publication Data
US 2017/0062645 A1  Mar. 2, 2017

Related U.S. Application Data

(60) Provisional application No. 61/821,578, filed on May 9, 2013.

(51) Int. Cl.
| | |
|---|---|
| H01L 21/00 | (2006.01) |
| H01L 31/18 | (2006.01) |
| H01L 27/144 | (2006.01) |
| H01L 31/0224 | (2006.01) |
| H01L 31/032 | (2006.01) |
| H01L 31/0352 | (2006.01) |
| H01L 31/103 | (2006.01) |

(52) U.S. Cl.
CPC .......... *H01L 31/18* (2013.01); *H01L 27/1446* (2013.01); *H01L 31/022408* (2013.01); *H01L 31/032* (2013.01); *H01L 31/035227* (2013.01); *H01L 31/103* (2013.01)

(58) Field of Classification Search
None
See application file for complete search history.

(56) References Cited

U.S. PATENT DOCUMENTS

| | | | |
|---|---|---|---|
| 6,661,073 B1 | 12/2003 | Stievenard et al. | |
| 7,547,886 B2 | 6/2009 | Mueller | |
| 8,269,260 B2 | 9/2012 | Sargent | |
| 2005/0020923 A1* | 1/2005 | Frangioni | A61K 49/0017 600/473 |
| 2009/0242405 A1* | 10/2009 | Mayer | B81C 1/00214 204/435 |

FOREIGN PATENT DOCUMENTS

EP  2051303 A2  4/2009

OTHER PUBLICATIONS

De Cock B, 1985. Qualitative and quantitative explanations of the forms of heat sensitive organs in snakes, Acta Biotheoretica, 34: 193-206.
van Hooidonk E, Barthou C, Vigneron J P, Berthier S, (2013). Yellow Structurally modified fluorescence in the longhorn beetles *Celosterna pollinosa sulfurea* and *Phosporus visrrescens* (Cerymbycidae), Journal of Luminescence, 136: 313-321.
Yu, G., et al., "Contact printing of horizontally-aligned p-type Zn3P2 nanowire arrays for rigid and flexible photodectors", Nanotechnology, vol. 24, No. 9, (2013), 095703, (8 pages).
Andrzejewski, J., et al., "Energy Band Structure of Zn3P2-Type Semiconductors: Analysis of the Crystal Structure Simplifications and Energy Band Calculations", phys. stat. sol. (b), vol. 227, No. 2, (2001), pp. 515-540.
Anfinsen, C.B., "Principles that govern the folding of protein chains", Science, vol. 181, No. 4096, Jul. 20, 1973, pp. 129-131.
Beleites, Claudia, et al., "hyperSpec: a package to handle hyperspectraldata sets in R, in preparation, R package version 0.98-201209223", CRAN Respository, Sep. 23, 2012, 113 pages, http://hyperSpec.r-forge.r-project.org.
Broenstrup, G., et al., "A precise optical determination of nanoscale diameters of semiconductor nanowires", Nanotechnology, vol. 22, (2011), 385201, 9 pages.
Broenstrup, G., et al., "Optical Properties of Individual Silicon Nanowires for Photonic Devices", American Chemical Society, vol. 4, No. 12, Nov. 16, 2010, pp. 7113-7122.
Bullock, T.H., et al., "Properties of an Infrared Receptor", Journal of Physiology, vol. 134, (1956), pp. 47-87.
Chuiko. G.P., et al., "Ordering and polytypism in $A_3^8 B_2^V$ crystals", Functional Materials, vol. 12, No. 3, (2005), pp. 454-460.

(Continued)

*Primary Examiner* — Calvin Y Choi
(74) *Attorney, Agent, or Firm* — Greer, Burns & Crain, Ltd; Steven P. Fallon

(57) ABSTRACT

The present invention includes a method for biomimetic-inspired infrared sensors utilizing a bottom up approach. This method includes providing a sinusoidal alternating electrical field between a preformed electrode gap comprising two gold micro-electrodes. Providing single needles of zinc phosphide crystals optimized for growth conditions using a physical vapour transport. Immobilizing at least one individual zinc phosphide nanowire in the preformed electrode gap using dielectrophoretic manipulation. And, placing and contacting the at least one individual zinc phosphide nanowire in the preformed electrode gap. Two nanowires are combined to form a lambda shape for improved sensing.

8 Claims, 16 Drawing Sheets

(56) References Cited

OTHER PUBLICATIONS

Das, R., et al., "Integration of Photosynthetic Protein Molecular Complexes in Solid-State Electronic Devices", Nano Letters, vol. 4, No. 6, (2004), pp. 1079-1083.
Decroix, D., et al., "Growth and electrical properties of Zn3P2 single crystals and polycrystalline ingots", Journal of Materials Science, vol. 22, (1987), pp. 1265-1270.
Dereniak, E.L., et al., "Infrared Detectors and Systems", John Wiley & Sons, Inc., (1988), pp. 152-195.
Evans, W.G., "Infrared Radiation Sensors of Melanophila acuminata (Coleoptera: Buprestidae): A Thermopneumatic Model", Annals of the Entomological Society of America, vol. 98, No. 5, (Sep. 2005), pp. 738-746.
Fagan, EA., "Optical properties of Zn3P2", J. Appl. Phys., vol. 50, No. 10, (Oct. 1979), pp. 6505-6515.
Frieden, B.R., "Probability, Statistical Optics, and Data Testing: A Problem Solving Approach", Springer-Verlag, Second Edition, (1991), pp. 22-257.
Griffiths, P.R., et al., "Fourier Transform Infrared Spectrometry", Wiley-Interscience, John Wiley & Sons, Inc., 542 pages.
Holst, G.C., "Common Sense Approach to Thermal Imaging", JCD Publishing, Winter Park, FL, Chapter 8 and Chapter 9, (2000), pp. 130-151.
Israelowitz, M., et al., "Biomimetic-inspired photo conductivity of Zn3P2", International Conference on Bio-Sensing Technology, May 13, 2013, 1 page.
Israelowitz, M., et al., "Fluorescence of the 'fire-chaser' beetle *Melanophila acuminate*", Journal of Luminescence, vol. 126, (2007), pp. 149-154.
Israelowitz, M., et al., "Mechanism of infrared Detection and Transduction by Beetle *Melanophila acuminata*", Journal of Bionic Engineering, vol. 8, (2011), pp. 129-139.
Keh, H.J., et al., "Slow motion of a droplet between two parallel plane walls", Chemical Engineering Science, vol. 56, Dec. 2001, pp. 6863-6871.
Kimball, GM., et al., "Photoluminescence-based measurements of the energy gap and diffusion length of Zn3P2", Applied Physics Letters, vol. 95, (2009), pp. 112103-1-112103-3.
Kronig, R. De L., et al., "Quantum Mechanics of Electrons in Crystal Lattices", Proceedings of The Royal Society (London), vol. A130, Feb. 3, 1931; pp. 439-531.
Leiterer, C., et al., "MicroNano Integration of Nanoscale Objects for Parallel Biosensorics", Proc. SPIE 8068, Bioelectronics, Biomedical, and Bioinspired Systems V; and Nanotechnology V,(2011), 5 pages.
Lopez-Alonso JP., et al., "NMR Spectroscopy Reveals that RNase A is Chiefly Denatured in 40% Acetic Acid: Implications for Oligomer Formation by 3D Domain Swapping", Journal of the American Chemical Society, vol. 132, (2010); pp. 1621-1630.
Marasco, P.L., et al., "Uncooled Infrared Sensor Performance", Infrared Technology XIX, SPIE Proceeding, vol. 2020, (1993), pp. 363-378.
McQuarrie, D.A., "The Kronig-Penney Model: A Single Lecture Illustrating the Band Structure of Solids", The Chemical Educator, vol. 1, No. 1, (1996), 10 pages.
Mink, J., "Infrared Emission Spectroscopy, Sampling Techniques, Other IR Sampling Techniques", Handbook of Vibrational Spectroscopy, John Wiliey & Sons, Ltd., 2002, pp. 1193-1214.
Misiewicz, J., "Inter-Band Transition in Zn3P2", J. Phys.: Condens. Matter.; vol. 2, No. 8, (1990), pp. 2053-2072.

Munoz, V., et al., "Optical Properties of zinc phosphide", Journal of Applied Physics, vol. 60, No. 9, Jul. 15, 1986, pp. 3282-3288.
Nyquist, R.A., et al., "Zinc Phosphide, Zn3P2", Handbook of Infrared and Raman Spectra of Inorganic Compounds and Organic Salts: Infrared Spectra of Inorganic Compounds, New York Academy Press, (2012), pp. 148-149.
Pohl, HA., et al., "Dielectrophoresis of Cells", Biophysical Journal, vol. 11, (1971), 711-727.
Pohl; H.A., "Dielectrophoresis: The behavior of neutral matter in nonuniform electric fields", Cambridge University Press, (1979), pp. 6-55 & 160-171, 476-481 (37 pages).
R Core Team, "2012, R: A language and environment for statistical computing—Version 2.15.1", R Foundation for Statistical Computing, Vienna, Austria, Jun. 22, 2012, 3496 pages.
Reuter; Matthias, "Analysing the Structure of Poly-crystalline Materials by 2-Dimensional DLS-Spectra and Neural Nets", B. Reusch (eds) Computational Intelligence. Theory and Applications. Fuzzy Days 2001. Lecture Notes in Computer Science, Springer, Berlin, Heidelberg, vol. 2206, (2001), pp. 420-429.
Reuter, Matthias, et al., "Supervising MultiCut Aggregates by Special Neural Nets", World Automation Congress (WAC), 2012, Jun. 24-28, 2012, 5 pages.
Schnelle, T., et al., "Dielectrophoretic manipulation of suspended submicron particles", Electrophoresis, vol. 21, (2000), pp. 66-73.
Sobolev, V.V., et al., "Optical Properties and Energy Band Structure of Zn8P2 and Cd3P2 Crystals", phys. stat. sol. (b) vol. 64, (1974), pp. 423-429.
Socrates, George, "Infrared and Raman Characteristic Group Frequencies: Tables and Charts, 3rd Edition", John Wiley & Sons, Ltd., (Jun. 2004), pp. 1-14 & 264-266, (15 pages).
Singh, R.P., et al., "Vacuum-Evaporated Zinc Phosphide Films and Their Characterization", phys. stat. sol. (a), vol. 100, (1986), pp. 493-500.
Stamov, I.G., et al., "Energetic Band Structure of Zn3P2 crystals", Physica B, vol. 408, (2013), pp. 29-33.
Stepanchikov, DM., et al., "Excitons into one-axis crystals of zinc phosphide (Zn3P2)", Condensed Matter Physics, vol. 12, No. 2, (2009), pp. 239-248.
Van Der Ziel, A., "Noise in Solid State Devices and Circuits", Wiley-Interscience, John Wiley & Sons, (1986), 102 pages.
Varshni, Y.P., "Temperature Dependence of the Energy Gap in Semiconductors", Physica, vol. 34, (1967), pp. 149-154.
Welch, V.L., et al., "Fluorescence in Insects", Proc. SPIE, The Nature of Light: Light in Nature IV, vol. 8408, Oct. 11, 2012, pp. 848004-1-848004-14.
Weyand, B., et al., "Three Dimensional Flow Modelling Inside a Differential Laminar Flow Bioreactor Filled with Porous Media", BioMed Research International, vol. 2015, (2015), pp. 1-9.
Wickham, H., "ggplot2: Elegant graphics for data analysis", (2009), 95 pages.
Wolfe, W., "Optic Materials", The Infrared Handbook, Chapter 7, (1978), pp. 3-128.
Wolff, A., et al., "Dielectrophoretic manipulation of DNA in microelectrode gaps for single-molecule constructs", Front Biosci., May 1, 2008, vol. 13, pp. 6834-6840.
Wolken, J.J., "Light Detectors, Photoreceptors, and Imaging Systems in Nature", Oxford University Press, (1995), 9 pages.
Wu, P., et al., "Fast-speed and high-gain photodetectors of individual single crystalline Zn3P2 nanowires", J. Mater. Chem., vol. 21, (2011), pp. 2563-2567.
Yang, R., et al., "Single-Crystalline Branched Zinc Phosphide Nanostructures: Synthesis, Properties, and Optoelectronic Devices", Nano Letters, vol. 7, No. 2, (2007), pp. 269-275.

* cited by examiner

Tables

Table 1: Allowed values of $\varepsilon = E/qV_0$ for a periodic potential described by equations (1.1) and (1.2) with the value $r = b/a = 0.20$ (taken from reference 36).

| Band | Range of $\varepsilon$ |
|---|---|
| 1 | 0.0616 to 0.0074 |
| 2 | 0.2425 to 0.2965 |
| 3 | 0.5325 to 0.6652 |
| 4 | 0.9192 to 1.1776 |
| 5 | 1.3980 to 1.8305 |
| 6 | 1.9791 to 2.6190 |
| 7 | 2.6850 |

TABLE 1

FIG. 7

Table 2. Geometrical values and characteristics of $Zn_3P_2$ microwires.

| Property | Value |
| --- | --- |
| Nanowire Diameter | 1.9 μm |
| Nanowire Length | 85 μm |
| Gap Width | 40 μm |
| Metal Film Height | 100 nm |
| Metal Film Material | Gold |

TABLE 2

FIG. 8

METHOD FOR PRODUCING BIOMIMETIC-INSPIRED INFRARED SENSORS FROM ZINC PHOSPHIDE MICROWIRES

PRIORITY CLAIM

The present application claims benefit under 35 USC Section 119(e) of U.S. Provisional Patent Application Ser. No. 61/821,578 filed on 2013 May 9. The present application is based on and claims priority from this application for all purposes and the disclosure is hereby expressly incorporated herein by reference.

FIELD OF THE INVENTION

The present invention relates to systems, methods, and devices used to imitate biological systems that sense light in the infrared and near-infrared frequencies. More specifically, the present invention relates to a method for producing biomimetic-inspired infrared sensors from zinc phosphide (Zn3P2) nanowires.

BACKGROUND

The Study of biological organism that have the ability to sense infrared and near-infrared light and the related photoconductivity and infrared spectrum properties include "Single-Crystalline Branched Zinc Phosphide Nanostructures: Synthesis, Properties, and Optoelectronic Devices" as described in Nanoscale Res Lett. 2009 May 15; 4(8):779-788, which therein describes hierarchical tree-shaped nanostructures, nanobelts, and nanowires of Zn3P2 were synthesized in a thermal assisted laser ablation process. All nanostructures are tetragonal phased Zn3P2 with excellent crystallinity and are free from an oxidization layer according to electron microscopy and X-ray diffraction analyses. Optical measurement revealed a strong absorption from the ultraviolet to near-infrared regions. Optoelectronic devices fabricated using individual nanowires demonstrate a high sensitivity and rapid response to impinging light. A crossed heterojunction of an n-type ZnO nanowire and a p-type Zn3P2 nanowire has been characterized, and it offers a great potential for a high efficient spatial resolved photon detector.

Also known are Zinc Phosphide Nanowires for Photon Detection, as disclosed in Yang et al., "Single-Crystalline Branched Zinc Phosphide Nanostructures: Synthesis, Properties, and Optoelectronic Devices," Nano Letters Vol. 7, No. 2, pp269-275 (2007). In this publication, the detection limit of the nanowire devices by an array of photodiodes could serve as nano-optoelectronic components in cameras, solar cells and scientific instruments.

Further teachings include "One-Dimensional Nanostructures and Devices of II-V Group Semiconductors" as disclosed by Shen G, Chen D. in Wuhan National Laboratory for Optoelectronics and College of Optoelectronic Science and Technology, Huazhong University of Science and Technology, Wuhan, 43007 4 People's Republic of China. Therein, the II-V group semiconductors, with narrow band gaps, are important materials with many applications in infrared detectors, lasers, solar cells, ultrasonic multipliers, and Hall generators. Since the first report on trumpet-like Zn(3)P(2) nanowires, one-dimensional (1-D) nanostructures of II-V group semiconductors have attracted great research attention recently because these special 1-D nanostructures may find applications in fabricating new electronic and optoelectronic nanoscale devices. This article covers the 1-D II-V semiconducting nanostructures that have been synthesized till now, focusing on nanotubes, nanowires, nanobelts, and special nanostructures like heterostructured nanowires. Novel electronic and optoelectronic devices built on 1-D II-V semiconducting nanostructures will also be discussed, which include metal-insulator-semiconductor field-effect transistors, metal-semiconductor field-effect transistors, and p-n heterojunction photodiode.

Other related teachings include Infrared sensor systems and devices as disclosed in U.S. Pat. No. 7,547,886 Filed on Jul. 7, 2006 and Issued Jun. 16, 2009 to Michael Mueller. This reference discloses an organic material can be used in a modified strain gauge for IR transduction, resulting in an organic IR sensor. Infrared radiation incident on the organic material modulates a displacement of the material in order to detect the presence and intensity of IR radiation. This innovative design doesn't require cooling, and is sensitive to 9 and 3 μm—wavelengths that are emitted by mammals and forest fires, respectively. In addition, a photomechanical polymer can be used in a transistor based on a thin-film transistor (TFT), also resulting in an IR sensor. Through careful synthesis of the polymers, the photomechanical response of the transistor can be tailored to certain IR bands for detection purposes.

And, U.S. Pat. No. 6,661,073 titled "Semiconductor infrared detector and method for the production thereof," to Stievenard et al. teaches a semiconductor infrared detector includes in the following order: a semiconductor 10 substrate; a layer of electrically insulating material; and patterns formed in a semiconductor layer. The patterns are formed from at least one island that is connected to bridges which are connected to polarization electrodes. The bridges are lines having an approximately constant width Ip and the islands are zones having a width li that is greater than that of the lines.

In addition, U.S. Pat. No. 8,269,260, titled "Materials, systems and methods for optoelectronic devices," Filed on Aug. 22, 2011 and Issued Sep. 18, 2012 to Edward Sargent, discloses a photodetector is described along with corresponding materials, systems, and methods. The photodetector comprises an integrated circuit and at least two optically sensitive layers. A first optically sensitive layer is over at least a portion of the integrated circuit, and a second optically sensitive layer is over the first optically sensitive layer. Each optically sensitive layer is interposed between two electrodes. The two electrodes include a respective first electrode and a respective second electrode. The integrated circuit selectively applies a bias to the electrodes and reads signals from the optically sensitive layers. The signal is related to the number of photons received by the respective optically sensitive layer.

SUMMARY OF THE INVENTION

The present invention relates to a method for the immobilization of an individual Zn3P2 nanowire in an electrode gap utilizing a sequence of dielectrophoretic manipulations for placement of Zn3P2 nanowires and contacting them on a preformed electrode gap, the method comprising placing, by dielectrophoresis, individual nanowires in the electrode gap to provide a single nanowire bridge; providing single needles of zinc phosphide (Zn3P2) grown by physical vapour transport; and providing an alternating electrical field to enable dielectrophoretic manipulation of zinc phosphide and providing a methanol solution for use in the alternating electrical field and providing two gold microelectrodes to produce the alternating electrical field.

This method can be used to develop many practical devices. First, an integrated circuit (IC) microchip ("chip") can be developed for sensing infrared light or, more specifically for detecting objects in low light conditions be detecting light waves reflecting off of objects in low light conditions by using the methods of the present invention.

This, of course, leads to the development of a camera using such a chip.

Nature has provided certain species, such as snakes and insects with specific sensors for light detection in the infrared range. The black fire beetle, *Melanophila acuminate* (*M. acuminate*), is one such insect that has a pair of natural infrared detectors. The position and composition of the infrared sensors in *M. acuminata* have been extensively studied in this field. We discovered that the tulip-shaped protein region within each sensillum, with its lipid borders, is highly sensitive for infrared radiation at wavelengths around 3 µm and between 10 and 25 µm. To use a biomimetic approach to transfer this intriguing idea from nature into modern technical applications such as an infrared microchip, several points need to be considered.

First, the unique composition and structure of the natural infrared sensor has to be transferred into a practical technical application. Second, natural elements of the sensor may require artificial substitutes with specific optoelectronic properties. Since proteins outside of their biological system begin to denature, durable synthetic alternatives are required. For example, Das et al. were able to integrate a bacterial reaction center and a plant photosystem, the spinach chloroplast, into a solar cell of organic semiconductor system in order to convert light into electricity, but the proteins denatured within two weeks. To avoid problems due to the natural denaturating process inorganic semiconductors or inorganic semiconductor materials with photoconductive activity in the infrared range must be considered. One such suitable inorganic semiconductor is zinc phosphide.

Any detector, whether it is synthetic or organic, needs to overcome thermal noise. The thermal noise is the difference between the source and the (environmental) background. Photons reaching a detector are not distributed uniformly in energy and frequency, thus it is difficult to screen the signal from the background, especially for the middle and far infrared bands—unless the system temperature is exceptionally cooled, for example, between 77-100 Kelvin. In *M. acuminata* the noise issue is solved by a multi sensor array that combines 150 to 200 sensilla to get a statistically distribution which suppressed the thermal noise (background).

Infrared absorbance characteristics of bulk zinc phosphide have been previously investigated and documented for the spectral range between 400 cm-1 and 3800 cm-1 and for the far infrared range between 45 cm-1 and 400 cm-1. Band patterns can be observed only in the far infrared region whereas the spectrum in the infrared region remains unstructured. Starting with an absorbance of 0.1 at 400 cm-1, the absorbance continually increases with increasing wavenumbers, reaching a value of 1 at approximately 3000 cm-1. Further investigations of the hh-(heavy holes) and lh-(light holes) bands have been reported in this art. Initial studies on photo-conductivity of single Zn3P2 nanowires have been reported by Wu et al. for the UV/VIS excitation wavelengths between 325 nm and 633 nm. In this study, which is a top-down approach using a sequence of photo-lithography steps, metal deposition and lift-off processes was utilized for wiring the Zn3P2 nanowire in an electrode gap formed by two gold electrodes. Another setup has been made by Yu et al. using lithograph-assembled arrays of Zn3P2 nanowires on silicon and PET substrates. Another approach, dielectrophoresis, has been used for the immobilization of individual silicon nanowires between electrodes to study their optical properties.

In contrast to the top-down process—for example as described by Wu et al. and Yu et al.—the present invention utilizes a novel, efficient bottom-up approach based on dielectrophoresis for placement and contacting of individual microwire in the electrode gap. The advantage of this technique is that it allows for the selective preparation of a single microwire bridge. Moreover, multiple electrode gaps on a single chip can be processed in parallel potentially allowing the cost efficient and reliable preparation of nanowire sensor arrays for camera and sensing applications.

BRIEF DESCRIPTION OF THE DRAWING

FIG. 7 includes Table 1: Allowed values for a periodic potential described by equations (1.1) and (1.2).

FIG. 8 includes Table 2: Geometric values and characteristics of the experimental device

DESCRIPTION OF THE INVENTION

Possible embodiments will now be described with reference to the drawings and those skilled in the art will understand that alternative configurations and combinations of components may be substituted without subtracting from the invention. Also, in some figures certain components are omitted to more clearly illustrate the invention.

The black fire beetle, *Melanophila acuminata* (*M. acuminata*) senses infrared radiation at wavelengths of 3 and 10-25 microns via specialized protein-containing sensilla. Although the protein denatures outside of a biological system, this detection mechanism has inspired our bottom-up approach to produce an IR sensing (detecting) device.

In developing the present invention, adult *M. acuminata* were provided by the Oregon Department of Agriculture in Salem, Oreg., USA and by the United States Forest Service, Southern Research Station in Stoneville, Miss., USA. Specimens of *M. acuminata* were collected at the Sandy River delta near Portland, Oreg., USA and Ollalie Lake, Cascade Range (Oregon, USA) at an elevation of 1615 m. The *M. acuminata* beetles were kept at 25° C. in humidified environment.

Figure 1A:
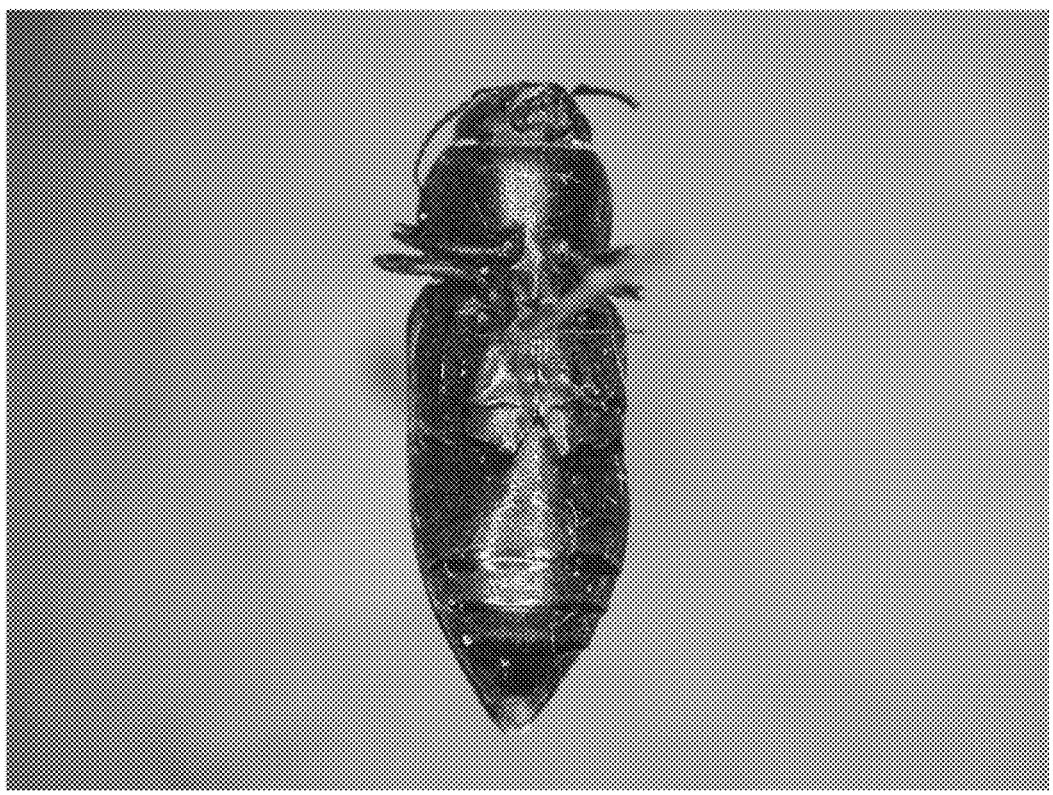
FIG. 1A is a photograph of the underside of the fire chaser beetle *M. acuminata* showing one of the two infrared sensory pits (red circle and arrow) by which the beetle detects and is attracted to forest fires across large distances.
Figure 1B:
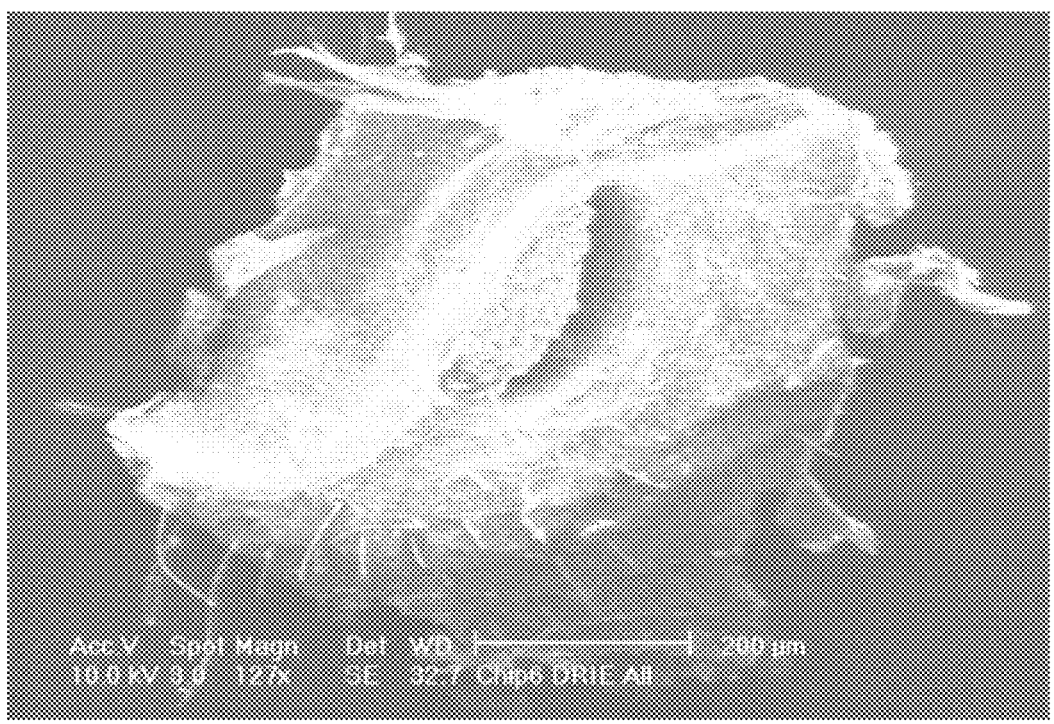
FIG. 1B Scanning electron micrograph of one *M. acuminata* sensory pit with 150 sensilla and FIG. 1C showing each sensillum having a top dimple used to filter wavelengths (with permission by Elsevier).
Figure 1C:
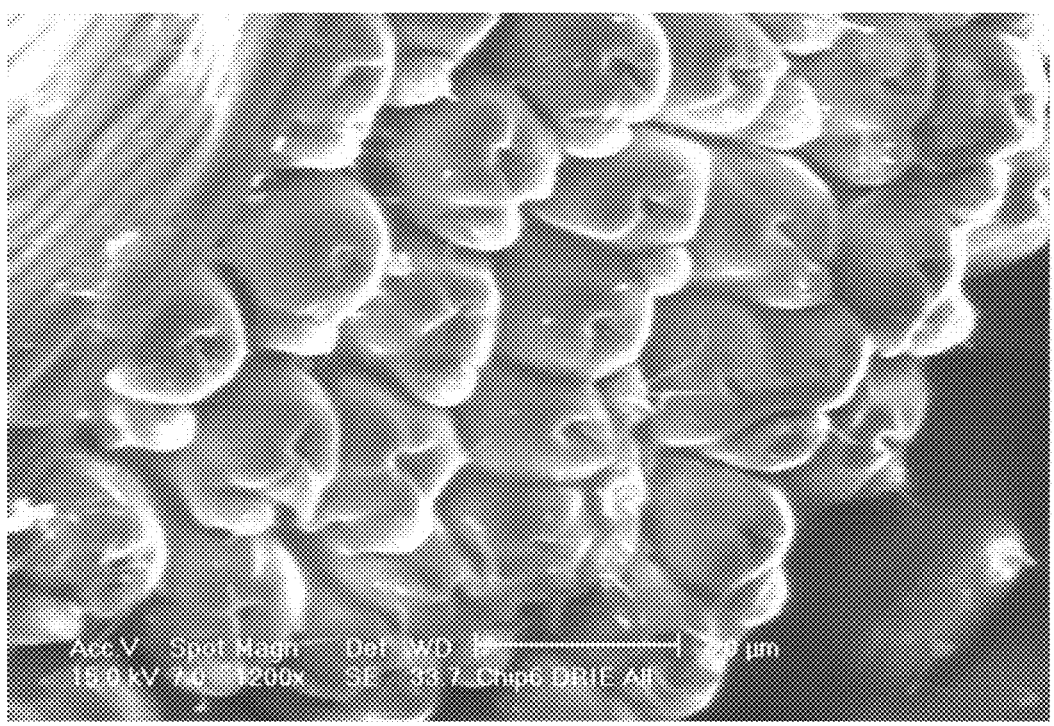
Figure 2:
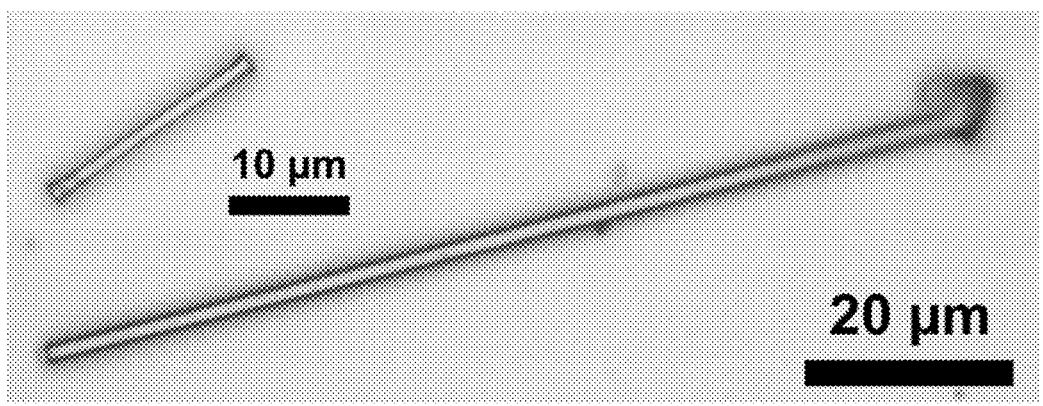
FIG. 2 is a picture of zinc phosphide needles used to measure light in the infrared spectrum. The geometry is added to measure the absorption.

The black fire beetle, Melanophila acuminate ("*M. acuminata*"), is one of those insects that possess natural infrared detectors in their sensilla. The position and composition of the infrared sensor in *M. acuminata* are shown in FIGS. 1A-1C.

These IR-sensing sensilla from *M. acuminata* were harvested using scanning electro-microscopy (SEM), such as a Philips XL 30 XL FEG SEM. The sensilla samples were treated with ethanol to remove the lipid in the cuticular region. However, due to denaturing of the organic sensilla, a non-organic material with infrared absorbance properties needed to be identified. Thus, the present invention imitates the biological behavior of the sensilla. The present invention is a biomimicry of this natural structure for sensing in the IR band.

The search for a material that would not denature and still sense in the IR band led to the discovery that a single zinc phosphide micro-wires, obtained via vapour transport, would work, if properly obtained.

Infrared absorbance characteristics of bulk zinc phosphide have been previously investigated and documented for the spectral range between 400 cm-1 and 3800 cm-1 and for the far infrared range between 45 cm-1 and 400 cm-1 (8). Band patterns can be observed only in the far infrared region whereas the spectrum in the infrared region remains unstructured. Starting with an absorbance of 0.1 at 400 cm-1, the absorbance continually increases with increasing wavenumbers, reaching a value of 1 at approximately 3000 cm-1. Further investigations of the hh-(heavy holes) and lh (light holes) bands have been reported.

On one hand, initial top down studies on photo-conductivity of single $Zn3P2$ nanowires have been reported by Wu et al. for the UV/VIS excitation wavelengths between 325 and 633 nm. In this top-down approach, using a sequence of photo-lithography steps, metal deposition and lift-off processes was utilized for wiring the $Zn3P2$ nanowire in an electrode gap, formed by two gold electrodes. Another setup is made by Yu et al. using lithograph assembled arrays of $Zn3P2$ nanowires on silicon and PET substrates.

On the other hand, dielectrophoresis is a bottom-up approach for the immobilization of individual silicon nanowires between electrodes for several prior art studies on their optical properties.

The present invention utilizes such a bottom-up approach for the immobilization of an individual $Zn3P2$ nanowire in the electrode gap. A sequence of dielectrophoretic manipulations enables placement of $Zn3P2$ nanowires and contacting them on a pre-formed electrode gap. In contrast to the top-down process, described by Wu et al. and Yu et al., the present invention's efficient bottom-up approach based on dielectrophoresis for placement and contacting of individual nanowires in the electrode gap allows the selective preparation of a single nanowire bridge. Moreover, multiple electrode gaps on a single chip can be processed in parallel allowing the cost efficient and reliable preparation of nanowire sensor arrays for camera and sensing applications.

Suitable zinc phosphide ($Zn3P2$) includes samples optimized for growth conditions consisting of single needles of zinc phosphide ($Zn3P2$) that were grown by physical vapour transport in a two-zone furnace. Powder $Zn3P2$ was used as the source material for needle growth. The material was sealed under vacuum (<1 Pa) in quartz ampoules in which the growth took place. The ampoules were carbon coated by cracking of methane at 1000° C. in order to avoid chemical reaction between the $Zn3P2$ and the silica and prevent oxidation.

The zinc phosphide, $Zn3P2$, micro-wires were immobilized and electrical contact was made by dielectrophoresis. Photoconductivity measurements have been extended to the near IR range, spanning the $Zn3P2$ band gaps. Purity and integrity of the $Zn3P2$ microwares including infrared light scattering properties have been confirmed by infrared transmission microscopy. This biomimetic-inspired microwire shows promise for infrared-detecting chip development.

Dielectrophoresis characterizes the motion of dielectric objects in an alternating electrical field and is proven to be a valuable technique for the manipulation of micro- and nano-sized objects. In our case dielectrophoretic manipulation of zinc phosphide was performed in a methanol solution using an alternating electrical field (sinusoidal) between two gold micro-electrodes. The micro-electrodes were set via photo-lithography providing gap widths in the lower micrometer range.

Photoconductivity measurements have been extended to the near IR range, spanning the $Zn3P2$ band gaps. Purity and integrity of the $Zn3P2$ nanowires including infrared light scattering properties have been confirmed by infrared transmission microscopy.

Fourier transform infrared spectroscopy (FTIR) was used to characterize the absorption properties of the $Zn3P2$ microwires. Infrared spectra of KBr tablets were acquired with an IFS 66 FT-IR spectrometer. About Ca. 0.6 mg $Zn3P2$ microwires were ground with approximately 200 mg KBr and pressed into a clear 12 mm KBr tablet. 128 co-additions at 4 cm-1 resolution were recorded between 400 cm-1 and 6000 cm-1.

FTIR-images of individual $Zn3P2$ microwires were collected in the spectral range from 1000 to 5000 cm-1 in transmission mode using a Varian 670 (Agilent, USA) FT-IR spectrometer equipped with a 64×64 pixel focal plane array (FPA) detector and a 15× Cassegrain objective. The nominal pixel size of this system is 5.6 µm. 64 scans of an empty CaF2 slide (background) and 32 scans of the microwires on the same CaF2 slide were co-added.

FTIR spectra were analyzed in R using packages hyperSpec for the spectroscopic data and ggplot2 for graphical display.

Zn3P2 is a p-type material with a band gap of about 1.4 eV, near the optimum for use in photovoltaic conversion of solar energy (28). Recently, theoretical band structure curves for zinc phosphide have been calculated, including effects of crystal field splitting of the valence band.

Zinc phosphide Zn3P2 has an anion sub-lattice in close proximity to the standard FCC (Face Centered Cubic) packing. Their cations occupy only three quarters of tetrahedral emptiness among anions. Thus, their cation sub-lattices contain exactly a quarter of vacancies, which may be recognized even as stoichiometric. These vacancies determine some key features of zinc phosphide as the presence of numerous discrete levels inside the band gap. The interaction between excitons and such deep defect levels leave to exciton recombination and/or the creation of multiple-exciton complexes. Reduction of system dimensionality, as that of zinc phosphide, sharply intensifies these effects.

As those of skill in the art would understand an exciton is a bound state of an electron and an electron hole that are attracted to each other by the electrostatic Coulomb force. An exciton is an electrically neutral quasi-particle that exists in insulators, semiconductors and in some liquids. It can transport energy without transporting net electric charge. An exciton can form when a photon is absorbed by a semiconductor. This excites an electron from the valence band into the conduction band. In turn, this leaves behind a positively-charged electron hole (an abstraction for the location from which an electron was moved). The electron in the conduction band is then effectively attracted to this localized hole by the repulsive Coulomb forces from large numbers of electrons surrounding the hole and excited electron. This attraction provides a stabilizing energy balance. Consequently, the exciton has slightly less energy than the unbound electron and hole.

A theoretical model for the band structure of a crystalline solid is given by the Kronig-Penney formulation. This formulation gives an analytically solvable model that visualizes the effect of the periodic potential on the dispersion relation of the electrons, i.e. the formation of a band structure characterized by the existence band gaps. Additionally, for many semiconductors the temperature dependence of the band gaps can be described with the empirical, three-parameter Varshni formula.

From this model McQuarrie provides an expression for the band structure of a crystalline solid with a one-dimensional periodic structure of the type:

$$V(x)=V0 \quad -b<x<0 \quad (1.1)$$

$$V(x)=0 \quad 0<x<a \quad (1.2)$$

The energy allowed values fall into continuous regions separated by gaps and are a function of both the relative energy of the electron in respect the eight of the potential well and the relative width of the well. A simple model that allows an easy development of this model can be seen where a plot of the energy against the wave number k showing the band gaps that appears in a crystalline solid. Table I gives the allowed values of $\epsilon$ for each band.

Zinc phosphide crystals were obtained as linear microwires or as lambda shaped arrangements of two linear microwires. Photoconductivity was analyzed for linear microwires. Lambda shaped arrangements were subjected to infrared spectroscopy in order to include both-linear and lambda junctions in the assessment of the spectral properties.

Figure 3A:
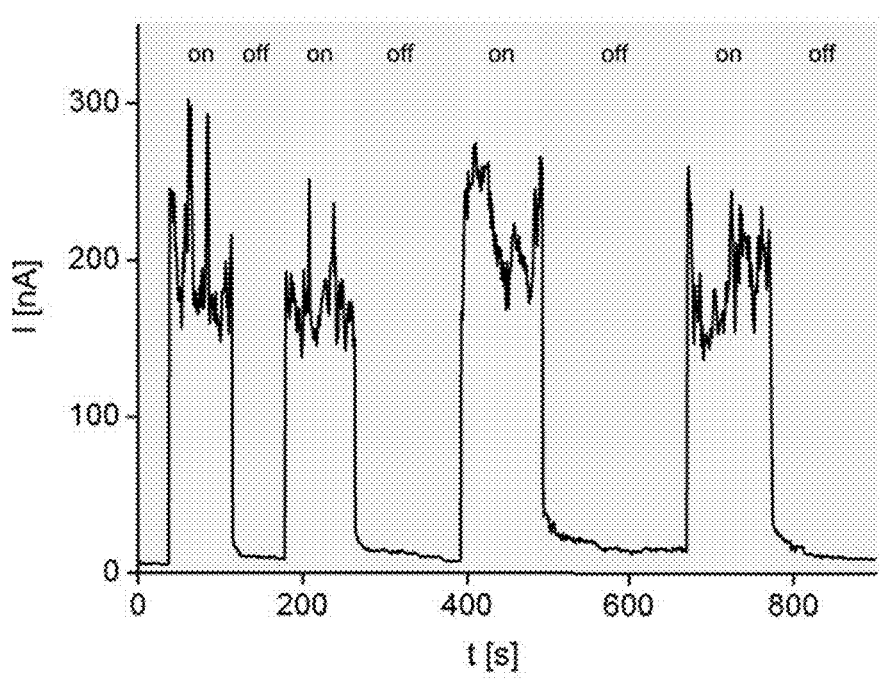
FIG. 3A is a chart illustrating photoresponse measurements as a function of time for white light excitation. The highlighted area shows point where the light was switched ON/OFF.

The geometric values of the experimental device are given in Table 2. The linear branch of zinc phosphide microwires were placed in the gap between two gold contacts. The chip substrate consists of several tapered electrodes; therefore the gap width varies from 1 µm-40 µm in the center of the chip. In order to measure the photo-response, the microwire sample was trapped and fixed between two electrodes and subsequently illuminated with white light (halogen lamp ~120 Watts). When exposed to white light, the zinc phosphide microwire gave a photocurrent higher than 100 nA depending on the light flow and time; without illumination the current was more than one order of magnitude lower than when exposed. FIG. 3A shows this response as a function of time, where response times are less than 1 second.

Figure 3B:
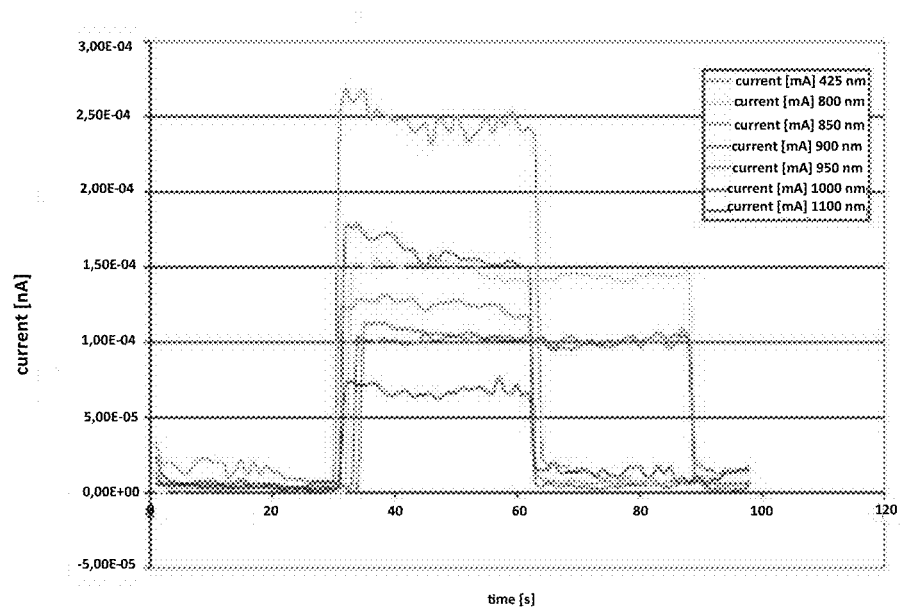
FIG. 3B currents of photoconduction at different wavelengths.

For the investigation of the photocurrent as a function of the illuminating wavelength metal interference filters were used. The resulting photo-response measurements are shown in FIG. 3B. It can be observed that response times remain less than 1 second for all of the considered wavelengths.

Figure 3C:
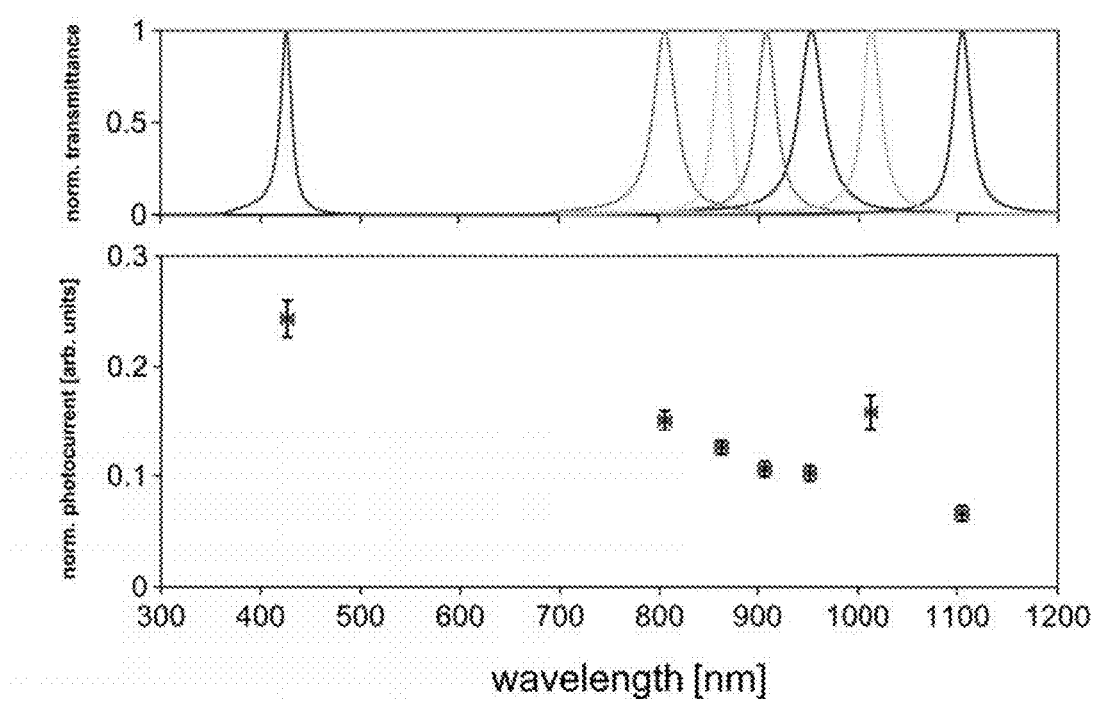
FIG. 3C Photocurrent as a function of the illuminated light, normalized in respect to surface power density, including the normalized transmission of the excitation filter characteristics from 300 nm to 1200 nm.

The photo current was measured using a source of 5 V; all currents were normalized to the same surface density of the illuminated light, FIG. 3C shows the normalized photocurrent of a single zinc phosphide (Zn2P3) microwire in dependence on the illuminated wavelength, the error bars indicated six fold standard deviation. The optical filter characteristics for the illumination and transmission are including FIG. 3c, normalized to 1. Kimball et al. have found the direct photoconduction for Zn2P3 microwires to be at 827 nm and the indirect photoconduction at 898 nm. In the studied region (400 nm-1200 nm), the plot of the photocurrent as a function of the excitation wavelength shows its maximum at low wavelengths and a relative maximum in the centre of the near infrared region (NIR) around 1000 nm.

FIG. 3E shows the I-V characteristics of a single microwire shown. The I-V characteristic suggests a diode like behavior, which is probably caused by schottky-barriers between the metal electrodes and the microwire. A resistance of about 400 MΩ can be derived considering the positive region.

Figure 4A:
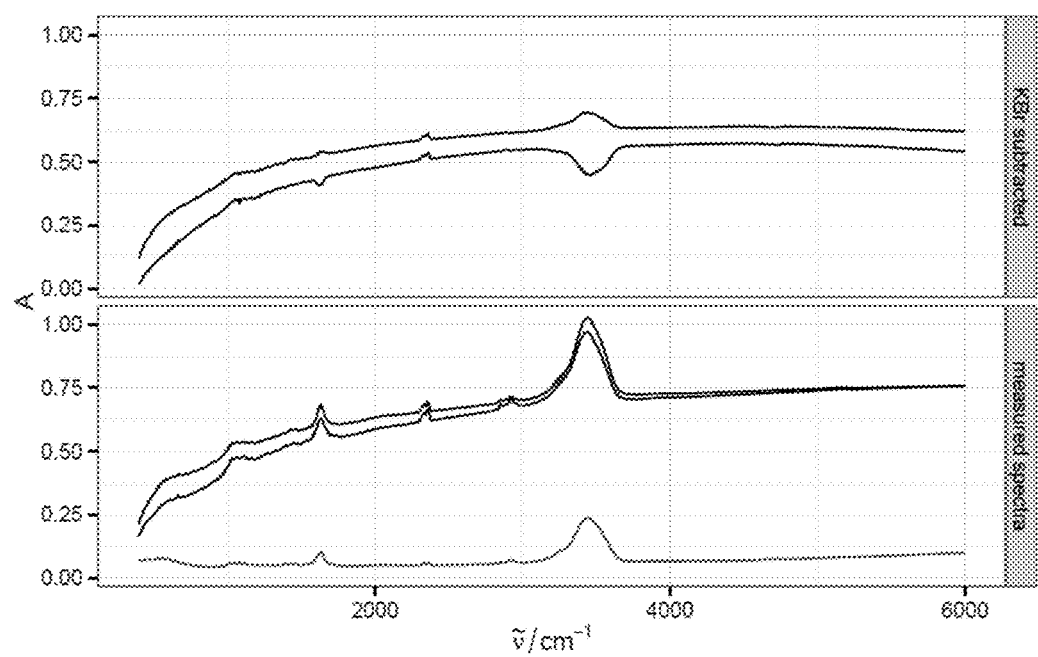
FIG. 4A is a chart showing FTIR spectra (absorbance) as a function of the wavenumber. Lower panel: powdered Zinc phosphide microwires in KBr (black, 2 tablets) and pure KBr powder (red line). Upper panel: corrected spectra for zinc phosphide powder (2 tablets).

The FTIR spectrum of Zn3P2 microwires ground in KBr was recorded as tablet in the spectral region from 400 cm-1 to 4000 cm-1. Two spectra from two tablets together with one spectrum of a pure KBr tablet (red) are shown in the lower panel of FIG. 4A. The upper panel shows the background corrected of the ground Zn3P2 microwire, obtained by manually subtracting multiples of the pure KBr spectra from the measurement in order to (compensate the vCH stretching vibrations of organic impurities between 2850 cm-1-3000 cm-1). Compared to the raw data, this dramatically reduces not only the vCH stretching bands, but simultaneously also the bands between 950 cm-1-1200 cm-1 and 1380 cm-1-1500 cm-1, which correspond to typical spectral regions of CH deformation vibrations and CC stretching vibrations of organic molecules. In addition, the spectral signatures of water (strong broad vOH around 3450 cm-1, δHOH at 1665 cm-1, and a broad signal below 900 cm-1) are mostly compensated for one tablet containing Zn3P2, and overcompensated for the other, leaving a residual CO2 signal (2350 cm-1 and 665 cm-1). All band assignments were checked with Socrates.

Thus, we attribute all vibrational bands to either impurities in the KBr, water, or CO2. The remaining, unstructured absorption corresponds to the spectrum published by Nyquist et al,. No additional bands, indicating e.g. presence of phosphate (1150 cm-1-1350 cm-1) or ZnO (450 cm-1) as possible results of the degradation of zinc-phosphide were observed.

Figure 4B:
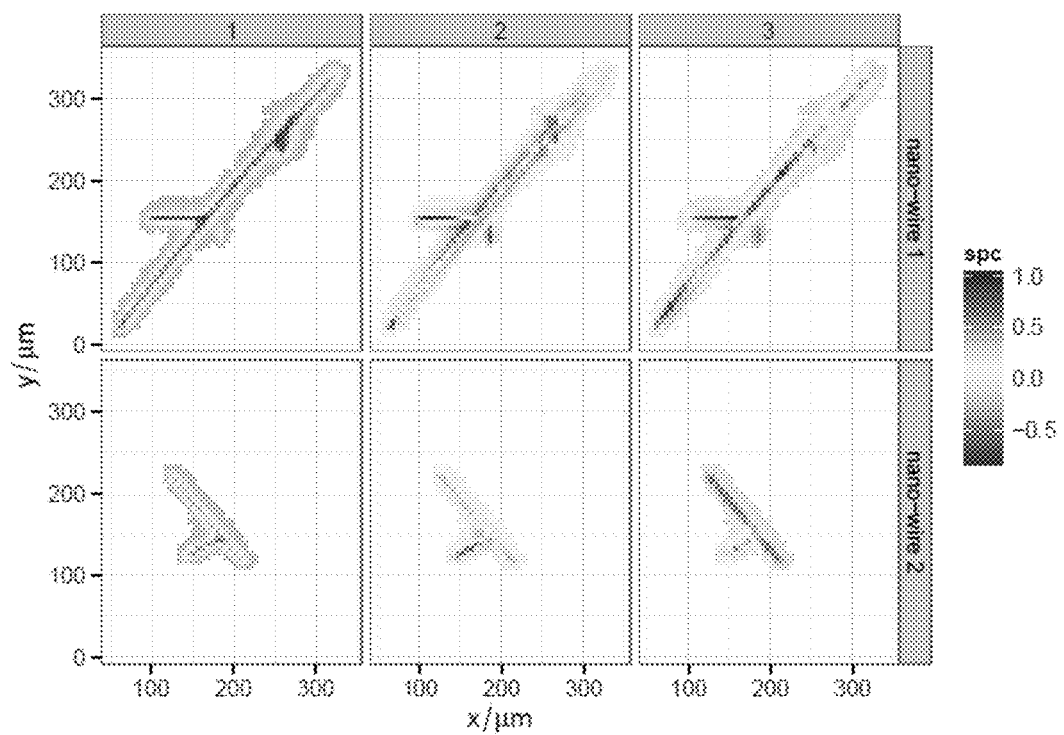
FIG. 4B Overall FTIR intensity (loss) map of a λ-shaped microwire, where the spectrum from 1000-5000 cm-1 was measured (red: lower transmitted light).
Figure 4C:
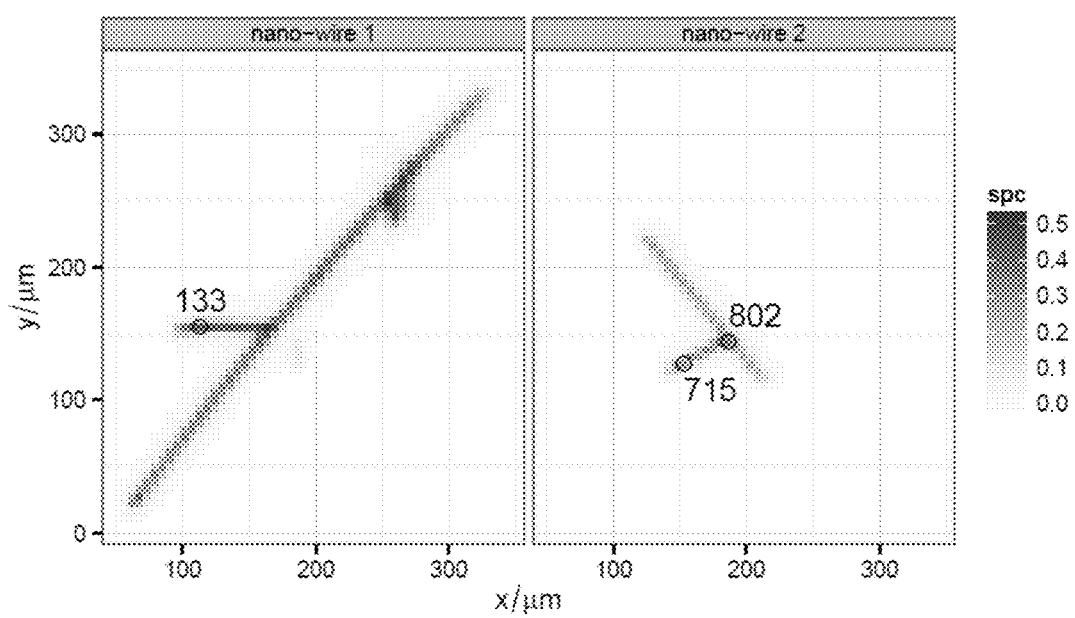
FIG. 4C two microwires, labels indicate different reference locations.
Figure 4D:
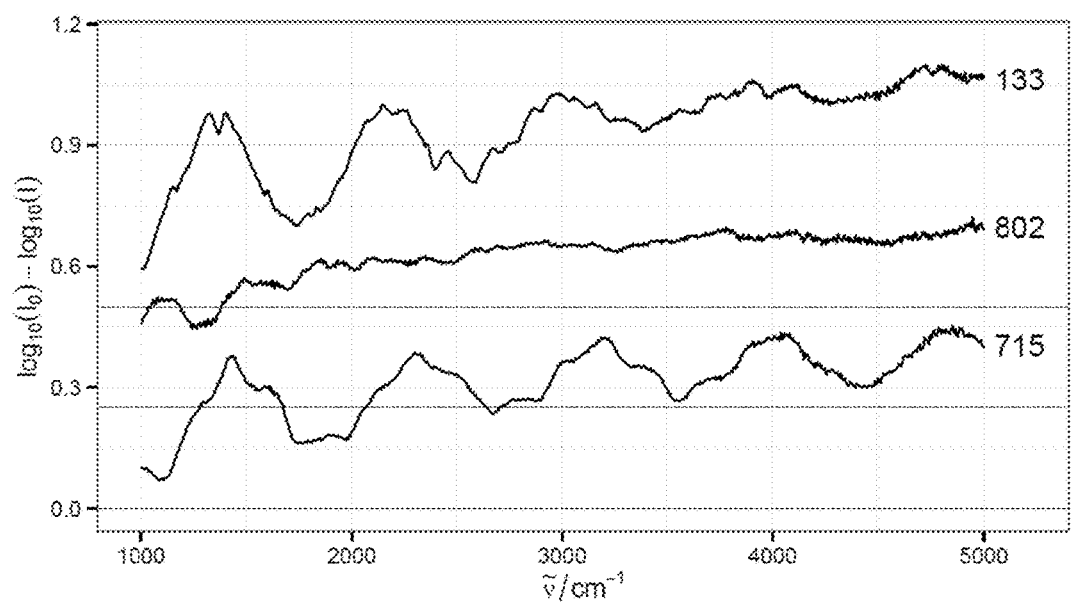
FIG. 4D FTIR transmission spectra as a function of the wavenumber at the reference locations of FIG. 4c PCA decomposition of the microwire spectra.

Individual microwires of zinc phosphide were subjected to infrared imaging in order to investigate the influence of local shape properties (linear fractions of different thickness, branches) on the infrared scattering characteristics. In contrast to the ground material, the infrared spectra of the individual zinc phosphide microwires exhibit a distinct spectral pattern dependent on the local shape of the crystal, reflecting the local light scattering properties of the crystal shape, FIG. 4B. A selection of the obtained spectra measured at distinct positions of the microwires is compiled in FIG. 4C. The observed infrared intensity (as log10 l-log10 l0) of the microwire as a function of the wavenumber is shown in FIG. 4D for each location. FIG. 4D show the results of a principal component analysis which gives an unsupervised decomposition of the spectroscopic data set into so-called loadings (latent spectra) and scores (latent concentrations), corresponding to the spectrum of the bulk Zn3P2 and FIG. 4D, corresponding to the microwire Zn3P2 spectrum, show strong similarities. This means that the most important part of the variation in the spectral pattern (which constitutes more than 95% of the total variance) is the intensity coming from the bulk material. The higher principal components correspond to additional varying scattering patterns. As the average spectrum shows scattering in addition to the spectral signature bulk Zn3P2 whereas the first principal component corresponds to the absorption spectrum, we conclude that across all spectra the scattering properties (which depend on the geometry) are remarkably constant. While a wide mix of different scattering patterns could cancel out to a shapeless loss in intensity similar to the loadings of the first principal component (also similar, though unrelated to the bulk Zn3P2 spectrum), such a mix of locally different scattering patterns should be accompanied by a variety of different scattering patterns across the sample which would mean that many principal components that describe scattering contributions should be observed describing a substantial amount of the total variance. This is not the case: the principal components that describe scattering cover less than 5% of the observed variance in the spectra.

Infrared detectors have a limitation related to the amount of signal that reaches the detector. It is beyond the quality of the detectors and is due to the fact that the photon incident to the detector and the detector itself cannot be changed or readily amplified.

This limitation can be explained from the blackbody radiation (the Stephan-Boltzmann law that gives the power radiated from a black body per unit surface in terms of its temperature i(s), where i(s) is equal to 5.670·10-8 (Wm-2K-4) and K is the temperature of the body). This law states that all objects above absolute zero emit radiation in the infrared part of the electromagnetic spectrum. Consequently infrared detectors have to be able to separate a signal from the background of the ambient radiation, which is defined as noise. As the statistical fluctuations of the background photon flux incident on the detector (photon noise) increase with the detector area, the small pinhole size of individual sensilla would reduce the thermal noise.

Kirchoff law states that if a body is in thermal equilibrium with its surrounding environment, then conservation of energy is required:

Emissivity and absorptivity go hand in hand. Thus good absorbers are good emitters and vice versa. So if an object at temperature T emits less energy than a black body at T, then it takes more energy to keep it at T because it absorbs less of what's available. A solution is given by *M. acuminata*, which has two infrared sensors that contain between 150 to 200 sensilla. Each sensillum detects the spread of noise on the average value distribution. Based on sensillium, it is not difficult to create a system using a multiple individual detection of spread.

Zinc phosphide absorption encompasses most of the infrared spectrum, therefore it is an ideal material to be considered as an infrared detector. As stated in this work the properties of Zn3P2 microwires joined with the ability to use the dielectrophoresis to make contacts in a branched chip structure, allows, following the geometry provided by the sensor of *M. acuminata*, to be optimistic in the possibilities of this semiconductor to build infrared sensors.

Zinc phosphide photoconductivity was analyzed for individual microwires in the spectral range between 425 and 1100 nm. A local maximum for the photoconductivity was found around 1000 nm of the excitation wavelength.

The FTIR spectrum of zinc phosphide microwire was compared to that from powdered zinc phosphide embedded with potassium bromide. The zinc phosphide band patterns were observed in the far infrared region, whereas the bulk spectrum in the infrared region remained unstructured (as expected from the literature), whereas the FT-IR microscopic images of individual microwires reveal also their scattering properties.

Due to its small size microwires, just like *M. acuminata* sensilla, have the advantage of overcoming photon noise, which is the major limitation for the development of middle and far infrared detectors. Our experiments have successfully demonstrated that dielectrophoresis can be used for Zn3P2 microwire construction and conduction for the purpose of obtaining a signal from infrared radiation. The photoconductivity results sustain that the Zn3P2 is able to be a photoconductor and the infrared spectrum of the microwire shows the spectrum absorption of this material, superimposed with strong wavelength-dependent scattering.

In another embodiment of the present invention, fourier transform infrared spectroscopy (FTIR) was used to characterize the absorption properties of the Zn3P2 microwires. Infrared spectra of KBr tablets were acquired with an IFS 66 FT-IR spectrometer Ca. 0.6 mg Zn3P2 microwires were ground with approximately 200 mg KBr and pressed into a clear 12 mm KBr tablet, 128 coadditions at 4 cm-1 resolution were recorded between 400 cm-1 and 6000 cm-1.

FTIR-images of individual Zn3P2 microwires were collected in the spectral range from 1000cm-1 to 5000 cm-1 in transmission mode using a Varian 670 (Agilent, USA) FT-IR spectrometer equipped with a 64×64 pixel focal plane array (FPA) detector and a 15× Cassegrain objective. The nominal pixel size of this system is 5.6 μm. 64 scans of an empty CaF2 slide (background) and 32 scans of the microwires on the same CaF2 slide were coadde and the FTIR spectra were analysed in R using packages hyperSpec for the spectroscopic data and ggplot2 for graphical display.

Zinc phosphide(Zn3P2) is a p-type material with a band gap of about 1.4 eV, near the optimum for use in photovoltaic conversion of solar energy. Recently, theoretical band structure curves for zinc phosphide have been calculated, including effects of crystal field splitting of the valence band.

Zinc phosphide(Zn3P2) has an anion sub-lattice in close proximity to the standard FCC (Face Centered Cubic) packing. Their cations occupy only three quarters of the tetrahedral emptiness among anions and the cation sub-lattices are exactly one quarter vacant. These vacancies determine some key features of zinc phosphide as the presence of numerous discrete levels inside the band-gap. The interaction between excitons and such deep defect levels allow for exciton recombination and/or the creation of multiple-exciton complexes. Reduction of system dimensionality, as that of zinc phosphide, sharply intensifies these effects.

Zinc phosphide crystals were produced as linear microwires or as lambda-shaped arrangements of two linear microwires. Photoconductivity was analyzed for linear microwires. Lambda-shaped arrangements were subject to infrared spectroscopy in order to include both-linear and lambda junctions in the assessment of the spectral properties. The geometric values of the experimental device are given in Table 2. The linear branches of zinc phosphide microwires were placed in the gap between two gold contacts. The chip substrate consisted of several tapered electrodes; therefore the gap width varied from 1 μm to 40 μm in the center of the chip. In order to measure the photo-response, the microwire sample was trapped and fixed between two electrodes and subsequently illuminated with white light (halogen lamp ~120 Watts). When exposed to white light, the zinc phosphide microwire gives a photocurrent higher than 100 nA depending on the light flow and time; without illumination, the current was more than one order of magnitude lower than when exposed. FIG. 3A shows this response as a function of time, where response times are less than 1 second.

Figure 6:
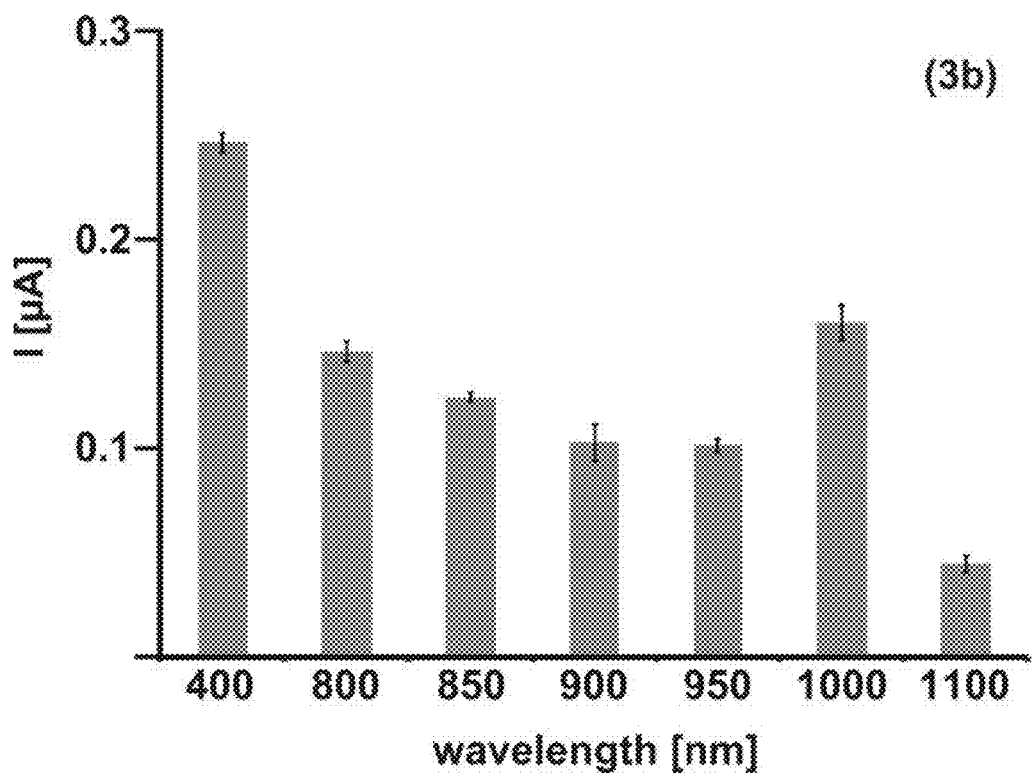
FIG. 6 is resulting photo-response measurements for the investigation of the photocurrent as a function of the illuminating wavelength using metal interference filters.

For the investigation of the photocurrent as a function of the illuminating wavelength, metal interference filters were used. The resulting photo-response measurements are shown in FIG. 6. It can be observed that response times remain less than 1 second for all of the considered wavelengths.

The photo-current was measured using a source of 5 V. All currents were normalized to the same surface density of the illuminated light. FIG. 3C shows the normalized photo-current of a single zinc phosphide (Zn2P3) microwire in dependence on the illuminating wavelength; the error bars indicated six fold standard deviation. The optical filter characteristics for the illumination and transmission are included in FIG. 3C, normalized to 1. Kimball et al., have found the direct photoconduction for Zn2P3 microwires to be at 827 nm and the indirect photoconduction at 898 nm. In the studied region (400 nm-1200 nm), the plot of the photocurrent as a function of the excitation wavelength shows its maximum at low wavelengths and a relative maximum in the center of the near infrared region (NIR) around 1000 nm.

Figure 3D:
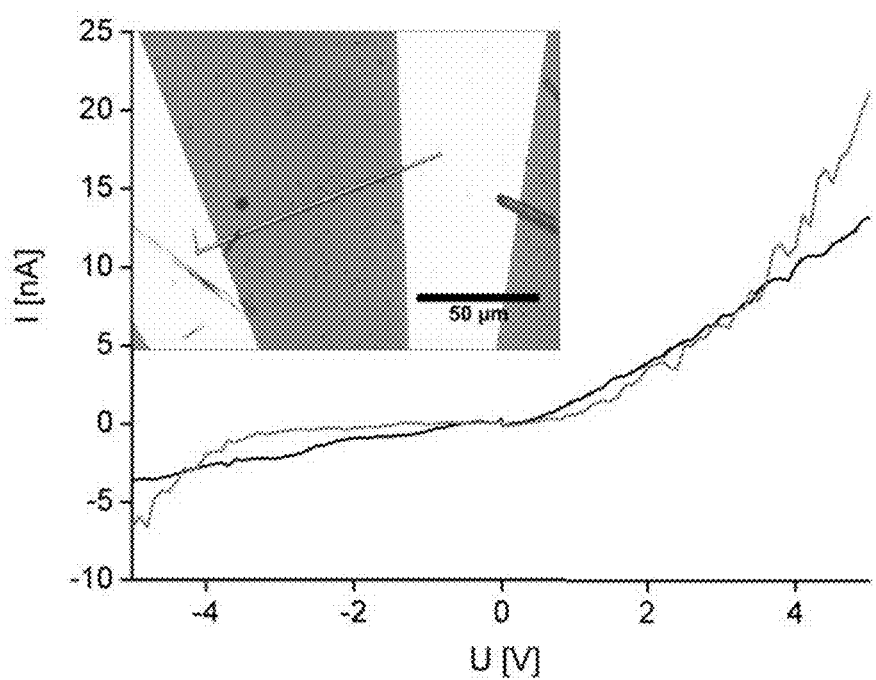
FIG. 3D I-V characteristics for a linear microwire. Inset shows the device made by dielectrophoresis. The zinc phosphide wire is contacted between two metal electrodes (height: 100 nm) with a gap of ~60 µm.

FIG. 3D shows the I-V characteristics of a single microwire. The I-V characteristic suggests a diode-like behavior, which is probably caused by Schottky-barriers between the metal electrodes and the microwire. A resistance of about 400 MΩ can be derived considering the positive region.

The FTIR spectrum of Zn2P3 microwires ground in KBr was recorded as a tablet in the spectral region from 400 cm-1 to 4000 cm-1. Two spectra from two tablets together with one spectrum of a pure KBr tablet (red) are shown in the lower panel of FIG. 4A. The upper panel shows the background corrected of the ground Zn3P2 microwire, obtained by manually subtracting multiples of the pure KBr spectra from the measurement in order to compensate the vCH stretching vibrations of organic impurities between 2850 cm-1 and 3000 cm-1. Compared to the raw data, this dramatically reduced not only the vCH stretching bands, but simultaneously also the bands between 950 cm-1-1200 cm-1 and 1380 cm-1-1500 cm-1, which corresponded to typical spectral regions of CH deformation vibrations and CC stretching vibrations of organic molecules. In addition the spectral signatures of water (strong broad vOH around 3450 cm-1, δHOH at 1665 cm-1, and a broad signal below 900 cm-1) were mostly compensated for one tablet containing Zn3P2, and overcompensated for the other leaving a residual CO2 signal (2350 cm-1 and 665 cm-1). All band assignments were checked with Socrates.

Thus, we attribute all vibrational bands to either impurities in the KBr, water, or CO2. The remaining unstructured absorption corresponded to the spectrum published by Nyquist et al., [17]. No additional bands, indicating for example the presence of phosphate (1150 cm-1-1350 cm-1) or ZnO (450 cm-1) as possible results of the degradation of zinc-phosphide, were observed.

Individual microwires of zinc phosphide were subjected to infrared imaging in order to investigate the influence of local shape properties (linear fractions of different thickness, branches) on the infrared scattering characteristics. In contrast to the ground material, the infrared spectra of the individual zinc phosphide microwires exhibited a distinct spectral pattern dependent on the local shape of the crystal, reflecting the local light scattering properties of the crystal shape (FIG. 4B). A selection of the obtained spectra measured at distinct positions of the microwires is compiled in FIG. 4C. The observed infrared intensity (as log10 I0-log10 I0) of the microwire as a function of the wavenumber is shown in FIG. 4D for each location. FIG. 4D shows the results of a principal component analysis which gives an unsupervised decomposition of the spectroscopic data set into so-called loadings (latent spectra) and scores (latent concentrations), corresponding to the spectrum of the bulk Zn3P2 and FIG. 4D, corresponding to the microwire Zn3P2 spectrum, shows strong similarities. As such, the most important part of the variation in the spectral pattern (which constituted more than 95% of the total variance) was the intensity coming from the bulk material. The higher principal components corresponded to additional varying scattering patterns. The average spectrum showed scattering in addition to the spectral signature bulk Zn3P2, whereas the first principal component corresponded to the absorption spectrum, and we therefore concluded that the scattering properties (which depend on the geometry) were remarkably constant across all spectra. While a wide mix of different scattering patterns could cancel out to a shapeless loss in intensity similar to the loadings of the first principal component (also similar, though unrelated to the bulk Zn3P2 spectrum), such a mix of locally different scattering patterns should be accompanied by a variety of different scattering patterns across the sample which would mean that many principal components that describe scattering contributions should be observed describing a substantial amount of the total variance. This was not the case: the principal components that described scattering covered less than 5% of the observed variance in the spectra.

Infrared detectors have a limitation related to the amount of signal that reaches the detector. It is beyond the quality of the detectors and is due to the fact that the photon incident to the detector and the detector itself cannot be changed or readily amplified.

This limitation can be explained from the blackbody radiation: the Stephan-Boltzmann law that gives the power radiated from a black body per unit surface in terms of its temperature. This law states that all objects above absolute zero emit radiation in the infrared part of the electromagnetic spectrum. Consequently infrared detectors have to be able to separate a signal from the background of the ambient radiation, which is defined as noise. As the statistical fluctuations of the background photon flux incident on the detector (photon noise) increase with the detector area [50; 51; 52], the *Melanophila acuminata* adaptation for this is the small pinhole size of individual sensilla would reduce the thermal noise.

Kirchoff's law states that energy conservation is required if a body is in thermal equilibrium with its surrounding environment:

$$\Phi_{incident} = \Phi_{absorbed} + \Phi_{reflected} + \Phi_{transmitted} \quad (2.1)$$

Emissivity and absorptivity go hand in hand. Thus good absorbers are good emitters and vice versa. So if an object at temperature T emits less energy than a black body at T, then it takes more energy to keep it at T because it absorbs less of what is available.

The noise problem in cameras and acoustical sensor systems,—and also in our system is the detection and elimination of the diverse noisy contributions from the picture producing parts of the camera. In sensor systems the main contributions of the noise components are white (band) noise, popcorn noise and thermal inducted low band or spike like noise.

A solution is given by *M. acuminata*, with its infrared sensors that contain between 150 to 200 sensilla. Each sensillum detects the spread of noise on the average value distribution. Based on the averaging phenomena of the sensilla, it is possible to create a system using a multiple individual detectors to deal with equilibrium issues, which can otherwise limit functionality of IR receptors.

Figure 5A:
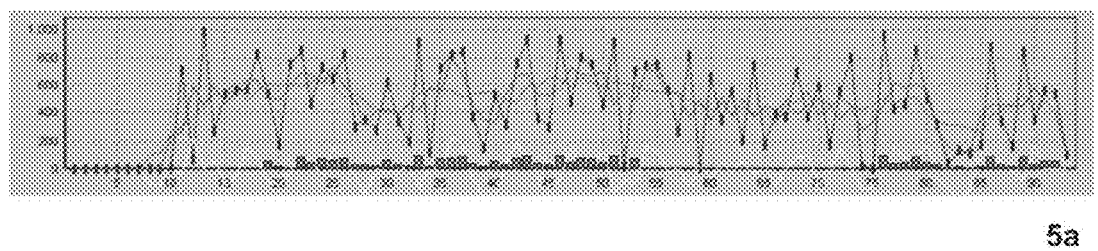
FIG. 5A loadings (latent spectra): average spectrum (thick black), principal components 1-3 (thick blue, medium green, thin red). The average spectrum shows scattering contributions in addition to a shapeless loss in intensity, which corresponds to the bulk spectrum (FIG. 4A), whereas the 1st principal component is very similar to the bulk spectrum. Higher components describe scattering.

The *M. acuminata* sensor is modeled in a Neural Network algorithm as parallel acting average routines with different class widths, simulating retinal signal processing by neuron and ganglion structures. As in nature, these averaging signal-processing structures combine different optical sensors or (small) frequency bands and therefore act as band detectors. If those band structures define the baseline signal as being clear of noise, it is possible to differentiate between noisy and non-noisy information; that is, an increased signal to noise ratio. This is shown in FIG. 5A, which takes 91 sensors there by mimicking the multiple sensors of *M. acuminata* and also refereed to as the auto power spectra.

Figure 5B:
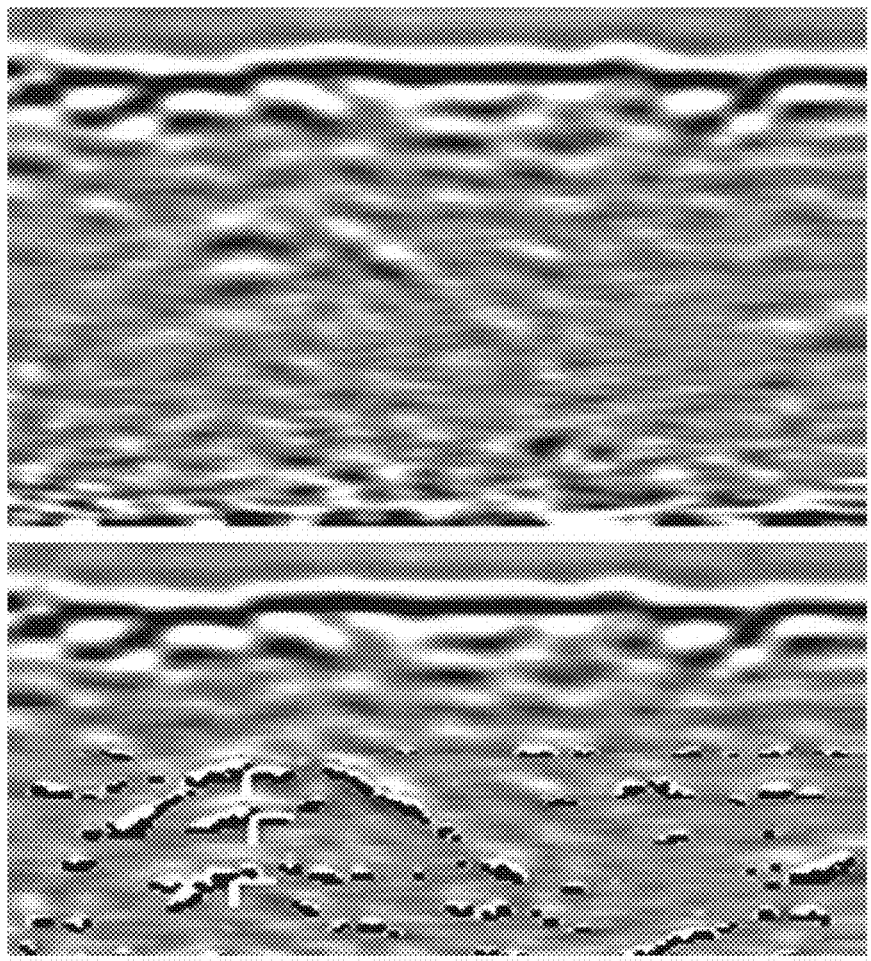
FIG. 5B shows the corresponding score (latent concentration) maps. Scattering patterns (PCs 2 and 3) are remarkably constant within parts of the microwires, e.g. branches.

For an optical application the algorithms implementing special neuron structures are suppressed or enlarged by self-adaptive weighting routines for local information of picture segments. FIG. 5B shows the image processing result, done by such neuron structures on a ground penetrating radargram.

Zinc phosphide absorption encompasses most of the infrared spectrum; therefore, it is an ideal material to be considered as an infrared detector. As stated in this work, the properties of Zn3P2 microwires joined with the ability to use dielectrophoresis to make contacts in a branched chip structure, creates the possibilities that this semiconductor can be used to build infrared sensors.

Although the invention has been particularly shown and described with reference to certain embodiments, it will be understood by those skilled in the art that various changes in form and detail may be made without departing from the spirit and scope of the invention.

We claim at least:

1. A method for preparation of biomimetic-inspired infrared sensors utilizing a bottom up approach, the method comprising:
   providing a sinusoidal alternating electrical field between a preformed electrode gap comprising two gold microelectrodes;
   providing single needles of zinc phosphide crystals optimized for growth conditions using a physical vapour transport;
   immobilizing at least one individual zinc phosphide nanowire in the preformed electrode gap using dielectrophoretic manipulation; and
   placing and contacting, between the two gold microelectrodes, the at least one individual zinc phosphide nanowire in the preformed electrode gap.

2. The method of claim 1 further comprising:
   providing a two-zone furnace for growing zinc phosphide single needles by vapour transport.

3. The method of claim 1 wherein the zinc phosphide is a powder suspended in the a methanol solution.

4. The method of claim 1 further comprising:
   providing a vacuum and quartz ampoules and sealing the zinc phosphide in the vacuum in quartz ampoules during growth.

5. The method of claim 4 further comprising:
   carbon coating the ampoules by cracking of methane at 1000-degrees ° C. to avoid a chemical reaction between the zinc phosphide and silica and prevent oxidation.

6. The method of claim 1 wherein providing single needles of zinc phosphide optimized for growth conditions using a physical vapour transport further comprises:
   producing linear microwires from the zinc phosphide crystals resulting in the at least one individual zinc phosphide nanowire.

7. The method of claim 6 wherein producing linear microwires comprises:
   producing at least two linear microwires; and
   creating lambda-shaped arrangements of two linear microwires.

8. A method for preparing a nanowire sensor array for infra red sensing applications, the method comprising:
   depositing one or more zinc phosphide nanowires in one or more electrode gaps on a single chip, the zinc phosphide nanowires being produced by
   providing a sinusoidal alternating electrical field between a preformed electrode gap comprising two gold microelectrodes;
   providing single needles of zinc phosphide optimized for growth conditions using a physical vapour transport, the zinc phosphide comprising a methanol solution;
   immobilizing at least one individual zinc phosphide nanowire in the preformed electrode gap using dielectrophoretic manipulation; and
   placing and contacting, between the two gold microelectrodes, the at least one individual zinc phosphide nanowire in the preformed electrode gap.

* * * * *